United States Patent [19]
Riechelmann et al.

[11] Patent Number: 6,093,030
[45] Date of Patent: Jul. 25, 2000

[54] CONTACT APPARATUS FOR INTEGRATED CIRCUITS

[76] Inventors: Bernd Riechelmann; Raymond Twigg; Jason Hsang Wang, all of 10840 Thornmint Rd., Suite 112, San Diego, Calif. 92127

[21] Appl. No.: 09/233,502

[22] Filed: Jan. 12, 1999

[51] Int. Cl.[7] ........................................ H01K 9/09
[52] U.S. Cl. .............................. 439/72; 324/755
[58] Field of Search ................. 439/70–73, 331; 324/754, 755, 765

[56] References Cited

U.S. PATENT DOCUMENTS

| | | | |
|---|---|---|---|
| 5,841,640 | 11/1998 | Shibata | 361/820 |
| 6,019,612 | 2/2000 | Hasegawa et al. | 439/73 |

*Primary Examiner*—Khiem Nguyen
*Attorney, Agent, or Firm*—Thomas J. Tighe

[57] ABSTRACT

An apparatus for electrically coupling a plurality of DUT terminals to corresponding terminals of a circuit. The apparatus includes a corresponding plurality of contact devices aligned both with the DUT terminals and the circuit terminals. Each contact device includes a fulcrum on which a contact lever is rockable over a range by pressing a corresponding DUT terminal against it. Each lever includes a first arm of "X" length on a DUT side of the fulcrum and a second arm of "Y" length on an opposite side of the fulcrum. A biasing spring, having travel, reacts against and through the second arm to resist rocking of the lever. Included is a way for electrically coupling the contact lever and its corresponding circuit terminal. The contact device operates according to the principle that contact lever travel, during rocking caused by a pressing upon it of a corresponding DUT terminal, is greater than responsive travel of the bias means according to a ratio of X/Y. The invention also includes a housing to contain the lever and bias means of each device in relation to each other. Preferably the bias spring of each device is a metal spring which is U-shaped and includes a fulcrum at an end of one long arm of the spring, the second long arm being a leaf spring reacting against the second (Y) arm of the contact lever.

16 Claims, 7 Drawing Sheets

CONTACT APPARATUS FOR INTEGRATED CIRCUITS

BACKGROUND OF THE INVENTION

This invention relates in general to the field of high cyclic endurance contact mechanisms for electrically communicating with integrated circuit devices, particularly for temporary connections for testing the devices after manufacture.

To verify that a newly manufactured integrated circuit device will perform to specifications, temporary solderless electrical connections must be made with special double-ended contacts. Each contact electrically couples one of a plurality of terminals of the device under test ("DUT") to a corresponding conductive trace on a printed circuit board called a "load board." A load board is part of an elaborate test apparatus that feeds electrical test signals into the DUT and evaluates response signals issuing from the DUT in response to said test signals. The contacts, being a vital connection between the DUT and the load board, must therefore not impair the signals so that the test apparatus can make an accurate assessment of the performance of the DUT.

This invention presents such a contact that is designed to have high cyclical endurance without degradation. It is ideal for testing high volume parts while minimizing down time for replacement of defective test contacts.

Other advantages and attributes of this invention will be readily discernable upon a reading of the text hereinafter.

SUMMARY OF THE INVENTION

An object of this invention is to provide a contact that is durable under frequent mechanical cycling.

A further object of this invention is to provide a contact that has a low ohmic resistance.

A further object of this invention is to provide a contact with semi-circular serrations to penetrate contamination.

A further object of this invention is to provide a contact that provides a short electrical path with low inductance.

A further object of this invention is to provide a contact consisting of two articulated parts.

A further object of this invention is to provide a contact in which a lever matches the force and travel provided by a stiffer spring to the force and travel required by a softer contact.

A further object of this invention is to provide a contact lever and spring system in which the spring can be located at various angles relative to the lever.

A further object of this invention is to provide a contact that does not cause undue wear of the load board due to scrubbing and/or rocking on the load board.

A further object of this invention is to provide a contact that is secured by a transverse monofilament polymer pin.

A further object of this invention is to provide a contact that can be easily replaced.

A further object of this invention is to provide a contact that scrubs the load board, the contact fitting into the same space as a contact supplying no scrubbing of the load board.

These objects, and other objects expressed or implied in this document, are accomplished by an apparatus for electrically coupling a plurality of DUT terminals to corresponding terminals of a circuit. The apparatus includes a corresponding plurality of contact devices aligned both with the DUT terminals and the circuit terminals. Each contact device includes a fulcrum on which a contact lever is rockable over a range by pressing a corresponding DUT terminal against it. Each lever includes a first arm of "X" length on a DUT side of the fulcrum and a second arm of "Y" length on an opposite side of the fulcrum. A biasing spring, having travel, reacts against and through the second arm to resist rocking of the lever. Included is a way for electrically coupling the contact lever and its corresponding circuit terminal. The contact device operates according to the principle that contact lever travel, during rocking caused by a pressing upon it of a corresponding DUT terminal, is greater than responsive travel of the bias means according to a ratio of X/Y. The invention also includes a housing to contain the lever and bias means of each device in relation to each other. Preferably the bias spring of each device is a metal spring which is U-shaped and includes a fulcrum at an end of one long arm of the spring, the second long arm being a leaf spring reacting against the second (Y) arm of the contact lever. Optionally in each device the longitudinal axis of the U-shaped spring is generally perpendicular to the motion of the DUT terminal pressing against the contact lever, or the longitudinal axis of the U-shaped spring is generally parallel to the motion of the DUT terminal pressing against the contact lever. Preferably each device includes a third arm extending from the contact lever to directly contact a corresponding circuit terminal, the third arm wiping the circuit terminal as it is contacting it. Preferably each device includes an edge of each contact lever which is pressed by the corresponding DUT terminal is serrated to scrub the terminal.

DESCRIPTION OF THE PREFERRED EMBODIMENT

Reference will now be made in detail to the present preferred embodiment, examples of which are illustrated in the accompanying drawings. Wherever possible, the same reference numbers will be used throughout the drawings to refer to the same or like parts.

Figure 1:
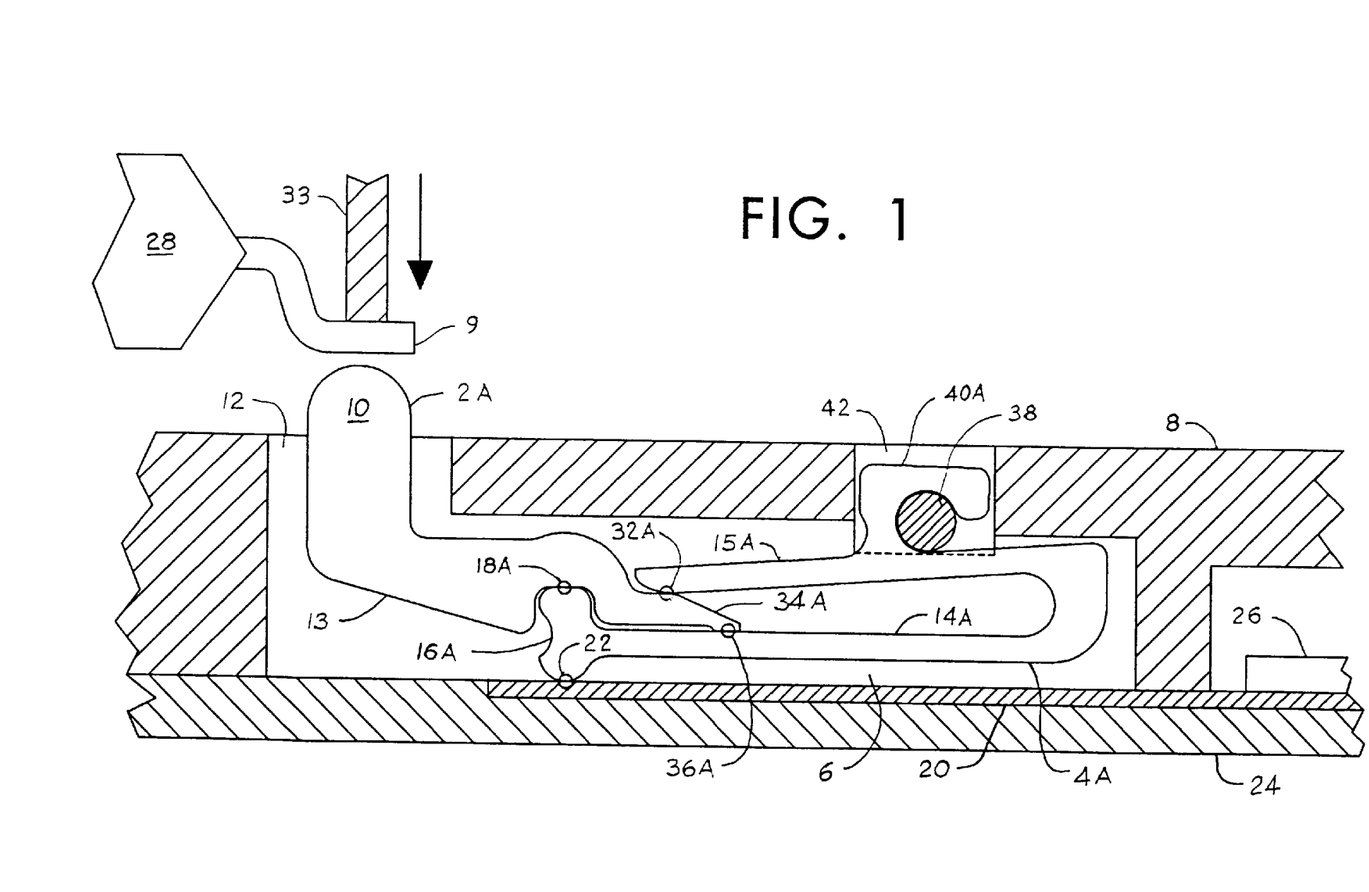
FIG. 1 is a lateral cross-sectional view of a first contact assembly while at rest according to this invention.
Figure 2:
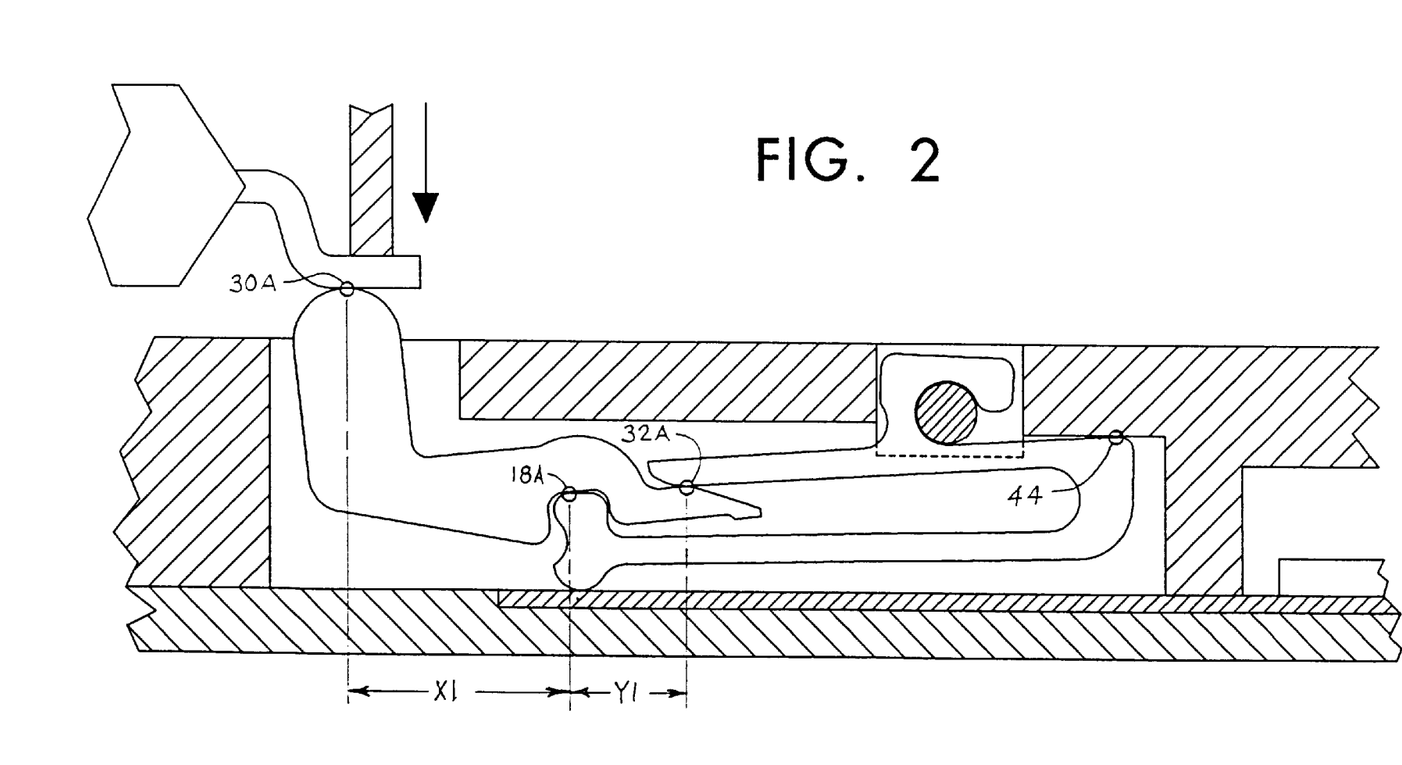
FIG. 2 is a lateral cross-sectional view of the contact assembly of FIG. 1 engaging a terminal of a DUT.

Referring to FIGS. 1 and 2, a generally L-shaped contact lever 2A and a generally U-shaped spring 4A are intertwined in a slot 6 defined by a contact housing 8. The contact lever includes a vertical arm 10 extending beyond the housing through an opening 12 communicating with the slot to make contact with a DUT lead 9. The lever also includes a generally horizontal shank 13 extending from the vertical arm into the slot 6. The spring 4A has two arms, a lower arm 14A and an upper arm 15A, which are joined at ends remote from the contact lever by an integral curved section. The unjoined end of lower arm 14A terminates in an endpiece 16A which is movably linked at a point 18A to the lever's shank 13 which defines a down-facing saddle and the endpiece includes an upper tongue which is disposed in the saddle and abuts it at point 18A. The endpiece 16A also has a lower tongue, similar to the upper tongue, but oppositely directed. The upper tongue makes an electrical connection with the lever at point 18A while the opposite, lower tongue makes electrical contact with a load board trace 20 at point 22. The load board trace is part of a load board 24, and the load board is a part of an electrical test apparatus, carrying a plurality of passive and active circuit components, such as 26, which are necessary for testing a DUT 28. The example DUT 28 has a plurality of terminals, such as 9 which makes an electrical connection with the lever 2A at point 30A when force in the direction of the arrow is applied by a pusher 33. In this manner, an electrical connection is established between the DUT and the load board.

Referring again to FIGS. 1 and 2, upper spring arm 15A applies pressure at a point 32A to a tail 34A of the lever's shank 13 urging the shank against DUT lead 9 as the shank pivots around point 18A. If no force is applied by the pusher 33, such as when the DUT is removed, the shank tail 34A is stopped at a point 36A where it abuts lower arm 14A. This limits the travel of the lever 2A and insures a precise starting position. The lever and the spring are retained in the slot 6 by means of a nonconductive pin 38 which is interposed between hook 40A of upper spring arm 15A and notch 42 of housing 8. The walls of the notch 42 secure against lateral movement of the hook 40A. Force applied at point 30A urges the assembly of the lever and the spring to rotate around point 18A. This rotation is limited by interference at a point 44 between a knob extending upwardly from the spring's curved section and the top of the slot 6.

Referring again to FIGS. 1 and 2, the pusher 33 is shared by a plurality of contacts. Due to unavoidable dimensional variations between the various components involved, the pusher must press the DUT's leads 9 beyond the point where contact is made, producing overtravel, in order to insure that all leads make good electrical contact. This overtravel causes the contact lever 2A to rotate around point 18A and as a result tail 34A spreads the spring arms 14A and 15A to permit elastic overtravel.

The desired contact force is typically 30 grams while the overtravel should be at least 0.015 inches. Prior art uses elastomeric springs because they fit well into the small space available. Unfortunately it is the nature of elastomers to have a short fatigue life, necessitating frequent replacement which raises the cost of testing. Metal springs on the other hand can have a very long fatigue life. However, a metallic spring which meets the above force and travel requirement is both bulky and fragile. But a metal spring can be made more compact and more robust if higher force with shorter travel are acceptable. This invention solves this problem by employing a lever system which transforms the high force and short travel of a compact and robust spring into a lower force with longer travel. Referring to FIG. 2, this is accomplished by the contact lever 2A having a longer arm of length X1 on the DUT side and a shorter arm of length Y1 on the metal spring 15A side. Contact travel at point 30A is increased compared to spring travel at point 32A to the ratio of distance X1 divided by distance Y1, whereas contact force at point 30A is decreased to the ratio of distance X1 divided by distance Y1.

Figure 3:
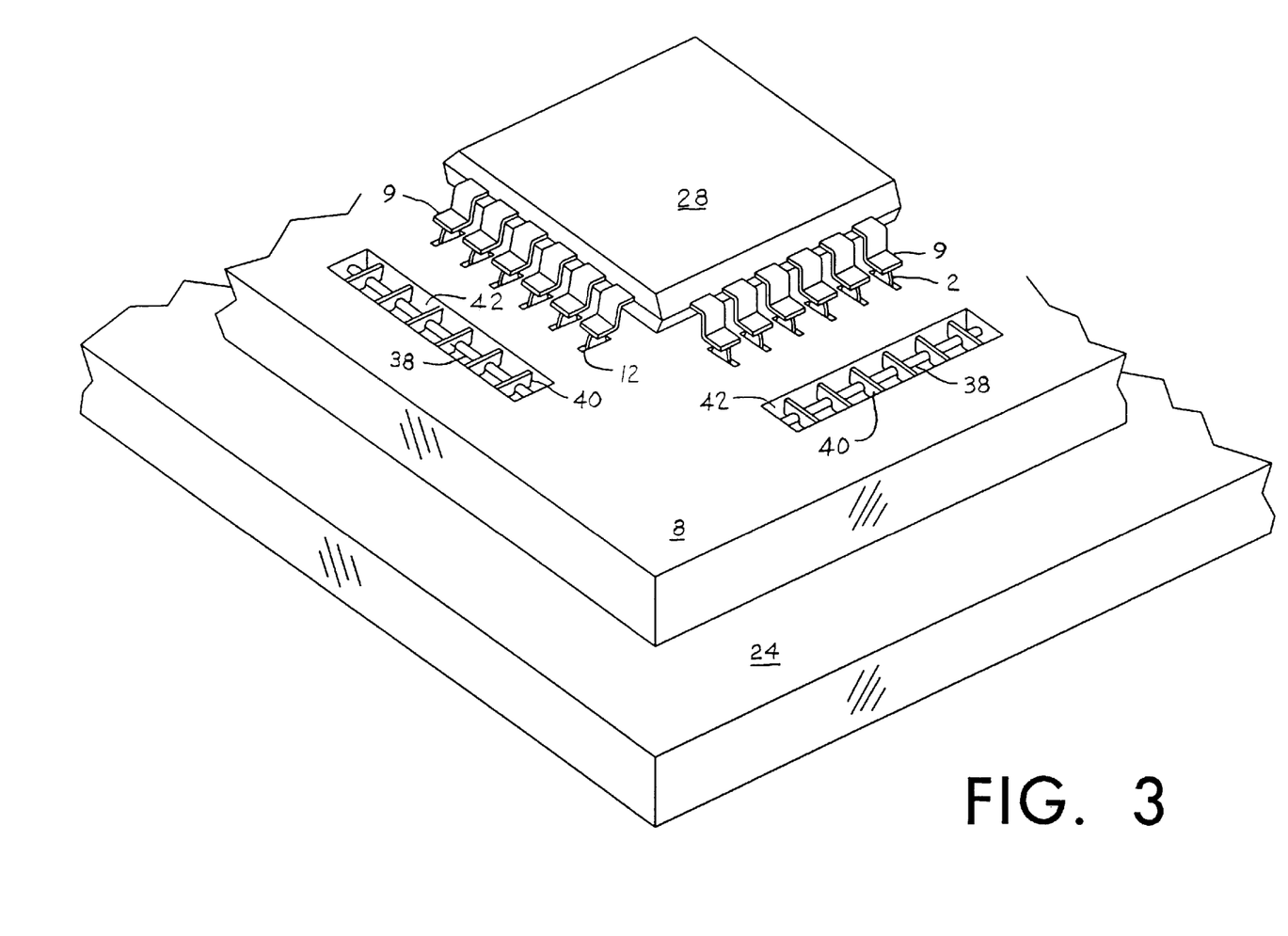
FIG. 3 is a perspective view of a contactor according to this invention engaging a DUT.

Referring to FIG. 3, the DUT 28 is illustrated to have a plurality of leads 9 along its sides. Each lead makes contact with a contact according to this invention when the leads are forced down by pushers (not shown for clarity).

The embodiment illustrated in FIGS. 1 and 2, can be modified depending on specific requirements. For example, the embodiments illustrated in FIGS. 4 and 5 work on the same principles as FIGS. 1 and 2, except that the spring has been relocated either upward as in FIG. 4 or downward as in FIG. 5. These arrangements are desirable in applications were special space constraints apply.

Figure 4:
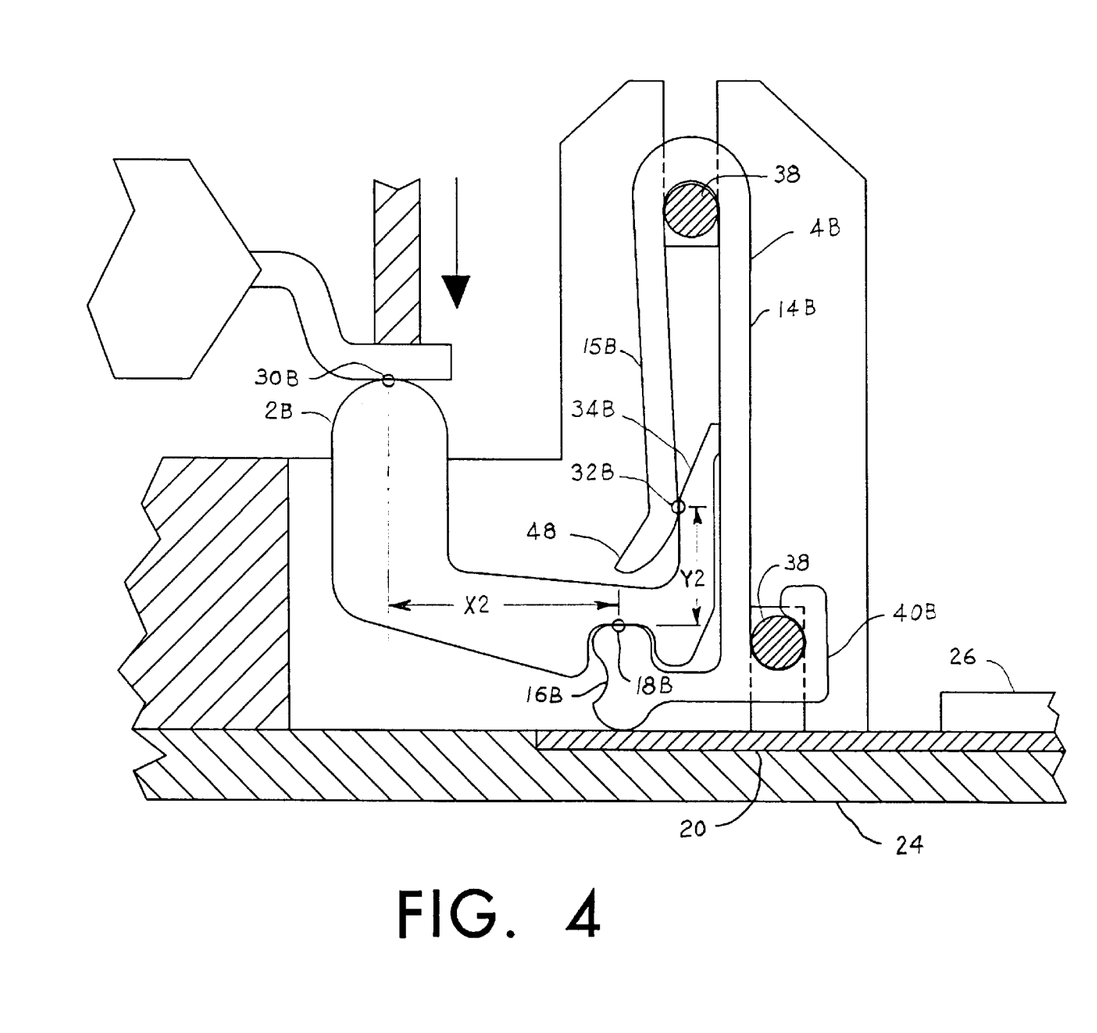
FIG. 4 is a cross-sectional view of a second contact assembly in which the spring is oriented vertically upward.

Referring to FIG. 4, the contact lever 2B is similar to the lever of FIG. 1 except that the lever's tail 34B extends vertically upward, instead of horizontally, to be between the arms, 14B and 15B, of the U-shaped spring 4B. Additionally the endpiece 16B is at the end of a right-angled extension at the unjoined end of arm 14B. A hook 40B engaged with a nonconductive pin 38, and a second nonconductive pin 38 disposed in the hollow of the curved section of the spring retain the lever and spring in place. As in the first embodiment of FIGS. 1 and 2, the contact lever 2B has a longer arm of length X2 on the DUT side and a shorter arm of length Y2 on the metal spring 4B side. Contact travel at point 30B is increased compared to spring travel at point 32B to the ratio of distance X2 divided by distance Y2, whereas contact force at point 30B is decreased to the ratio of distance X2 divided by distance Y2. An extension 48 has been added to retain lever 2B when no force is applied to it.

Figure 5:
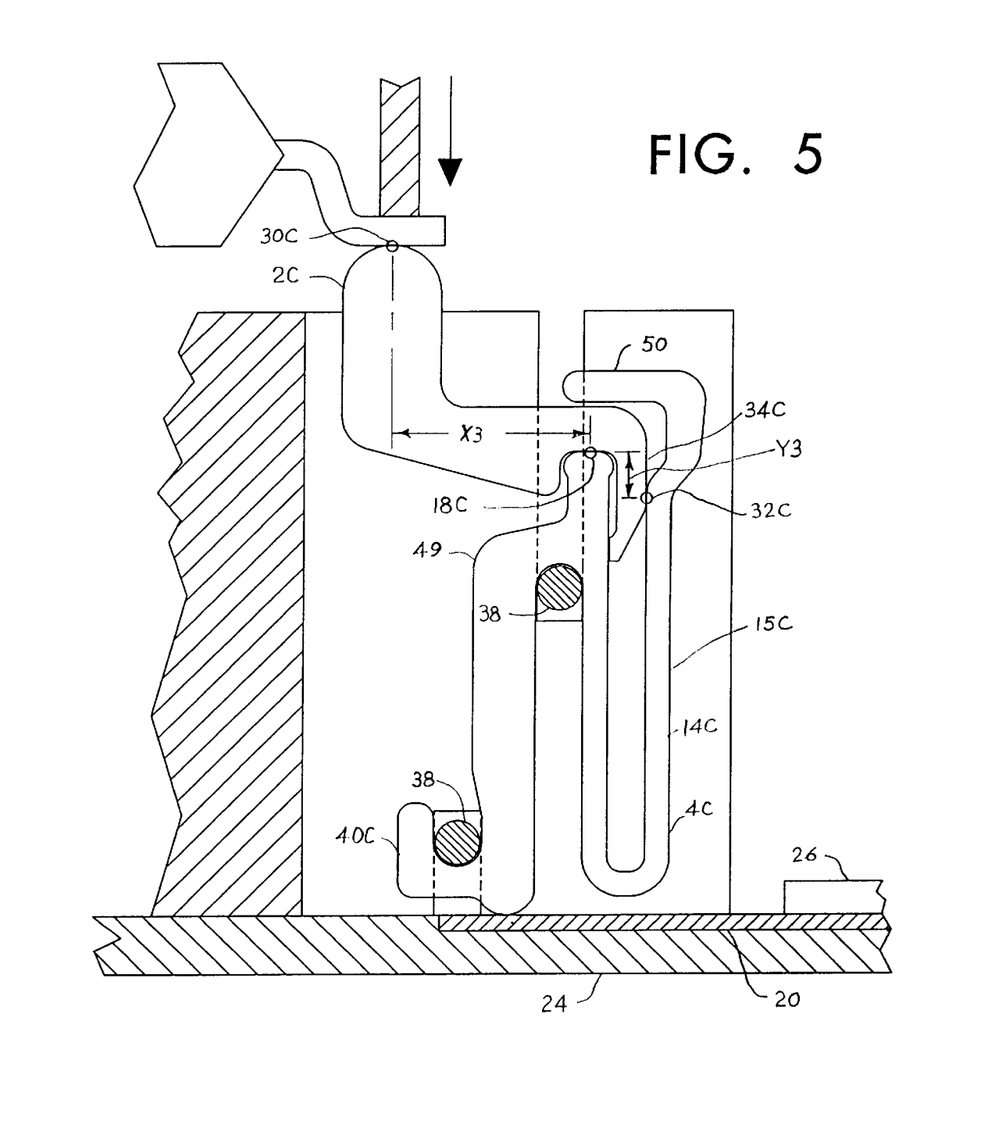
FIG. 5 is a cross-sectional view of a third contact assembly in which the spring is oriented vertically downward.

Referring to FIG. 5, the contact lever 2C is similar to the lever of FIG. 1 except that the lever's tail 34C extends vertically downward, instead of horizontally, to be between the arms, 14C and 15C, of the U-shaped spring 4C. The spring also has an S-shaped retainer 49 connected near the end of arm 14C. A hook 40C at one end of the "S" is engaged with a nonconductive pin 38, and a second nonconductive pin 38 is disposed in the hollow of the other end of the "S" to keep the lever and spring in place. As in the first embodiment of FIGS. 1 and 2, the contact lever 2C has a longer arm of length X3 on the DUT side and a shorter arm of length Y3 on the metal spring 4C side. Contact travel at point 30C is increased compared to spring travel at point 32C to the ratio of distance X3 divided by distance Y3, whereas contact force at point 30C is decreased to the ratio of distance X3 divided by distance Y3. An extension 50 has been added to retain lever 2C when no force is applied to it.

Figures 6, 7:
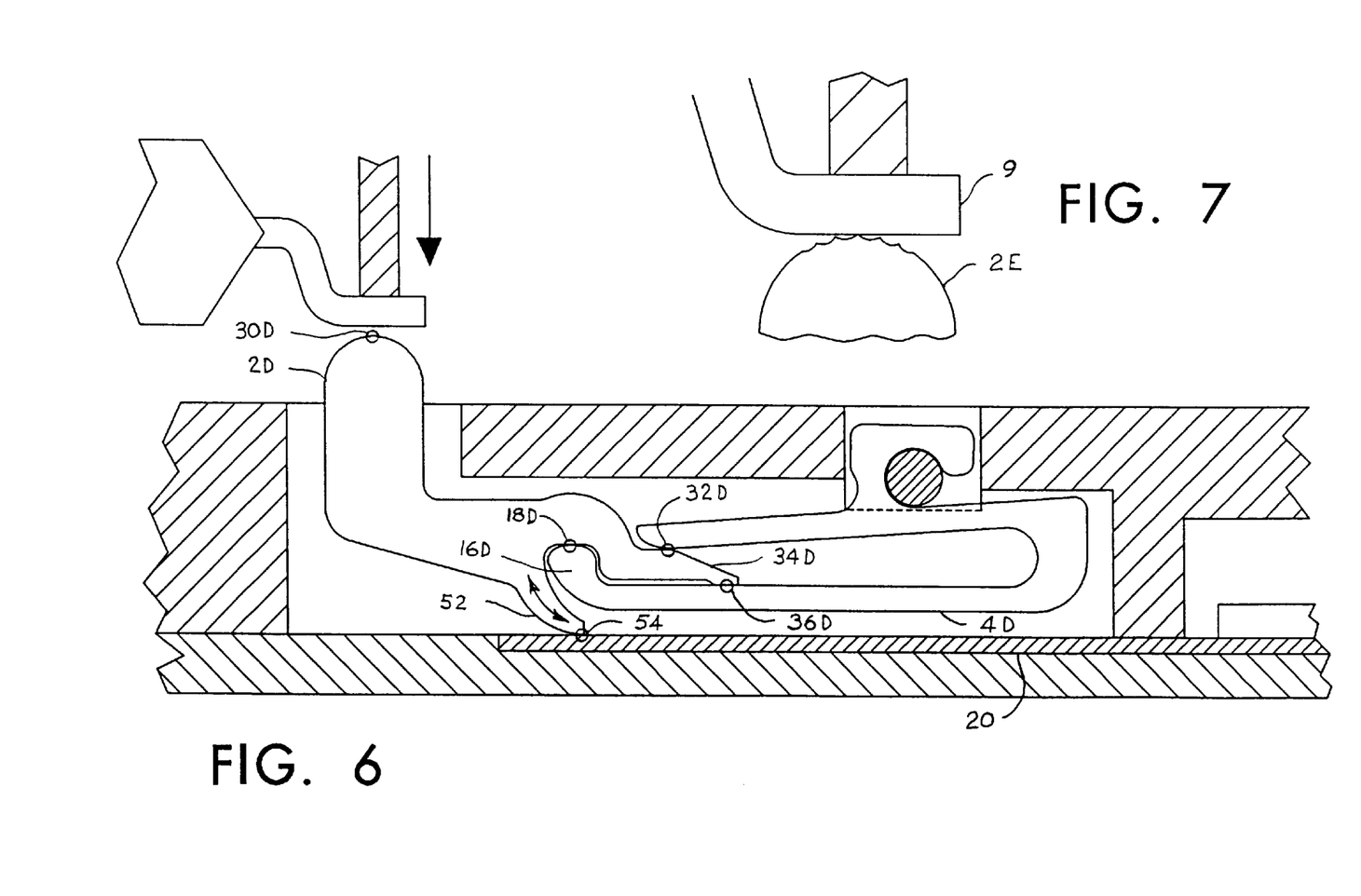
FIG. 6 is a cross-sectional view of a fourth contact assembly, which is designed to provide scrubbing where it connects to the load board.
FIG. 7 is a cross-sectional partial view of a contact lever which has semi-circular serrations for penetrating the contamination on the surface of the terminal of a DUT.

Referring to FIG. 6, illustrated is a modified embodiment for applications where extremely low ohmic resistance is desired. Lever 2D has an extension 52 which contacts trace 20 at point 54 directly instead of indirectly through an endpiece (such as 16A of FIG. 1), thereby establishing a direct connection between point 30D and the load board trace. Furthermore, the rotation of lever 2D around endpiece 16D causes scrubbing at the load board contact point in the direction of the arrows, thus ensuring low contact resistance. Also, the extension 52 permits electrical isolation between the spring 4D and the lever 2D if the surfaces at points 18D, 32D, and 36D are coated with an insulating and lubricating film.

Referring to FIG. 7, illustrated is an enlarged view of a contact lever 2E which has been modified to address applications where increased surface contamination is encountered on a DUT terminal 9. The lever has cut into it closely spaced radiused notches which result in sharp ridges thus facilitating penetration of surface contamination.

Figure 8:
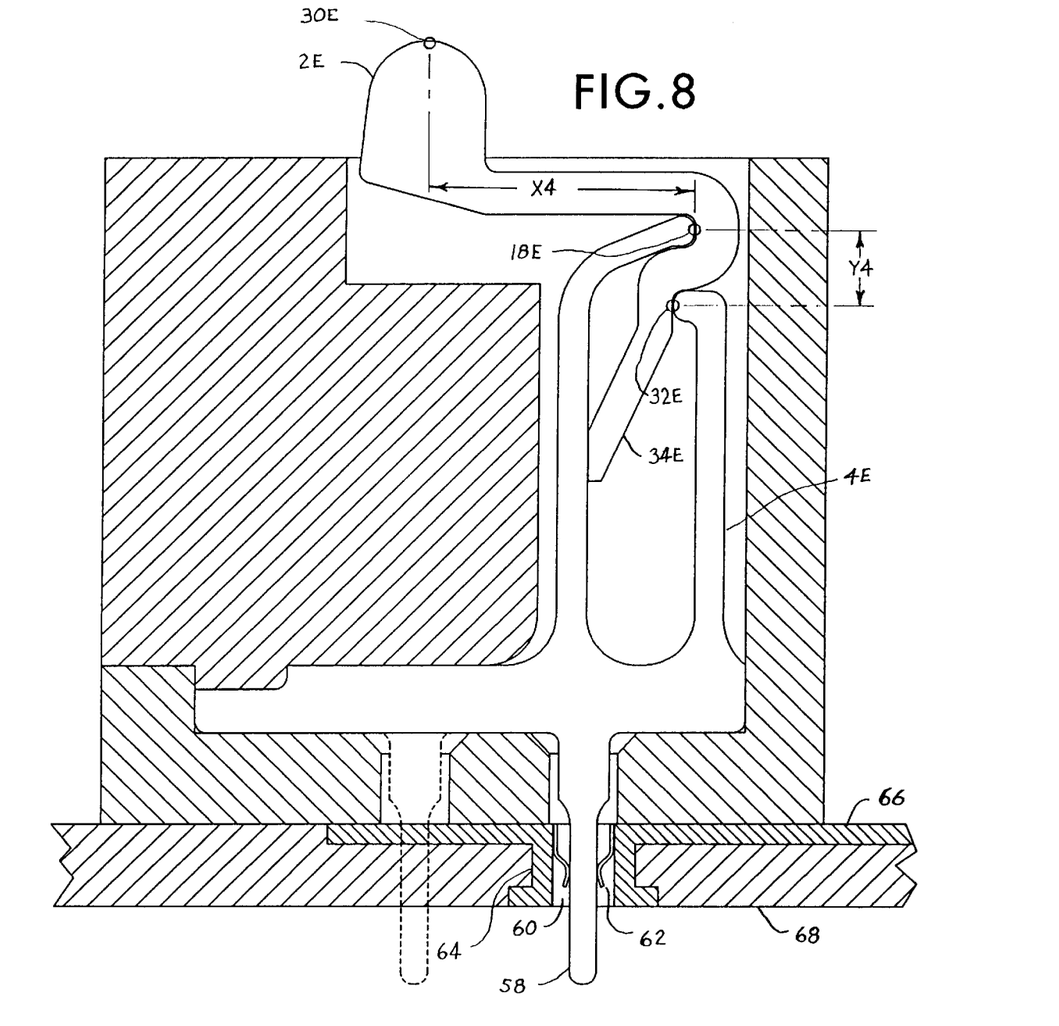
FIG. 8 is a cross-sectional view of a fifth contact assembly.

Referring to FIG. 8, a fifth embodiment is illustrated to be similar to the embodiment of FIG. 5 in that the U-shaped spring 4E is downwardly directed and the lever's tail 34E is also downwardly directed to be between the arms of the spring. In this embodiment the touch connection between the contact lever or spring and a load board surface trace 20 (e.g. as in FIG. 1) has been replaced by a prong and socket arrangement. A prong 58 extending downward from the spring 4E, through the housing, plugs into a receptacle 60 which establishes electrical coupling therewith via springs 62 which are secured, preferably press-fitted, in a plated through-hole 64 communicating with a signal trace line 66 on a load board 68. As in the first embodiment of FIGS. 1 and 2, the contact lever 2E has a longer arm of length X4 on the DUT side and a shorter arm of length Y4 on the spring side. Contact travel at point 30E is increased compared to spring travel at point 32E to the ratio of distance X4 divided by distance Y4, whereas contact force at point 30E is decreased to the ratio of distance X4 divided by distance Y4.

The two piece contact design of this invention permits specific selection of materials for optimal performance, such a good conductivity for the lever and good tensile endurance for the spring. For example, the material for the lever may be chosen to be beryllium copper for its high conductivity, while for the spring beryllium nickel or some other high strength alloy may be selected. As another example, a precious metals can be used for the lever while a non-precious metals can be used for the spring. Contacts according to this invention can be tailored to specific test requirements. A user can achieve higher conductivity at lower cost. Also, especially in the design of FIG. 6 because the spring does not need to carry any current, the typically poor conductivity of high strength alloys used for the spring does not require an unacceptable sacrifice in conductivity. A user can also choose a load board trace scrubbing configuration, as is FIG. 6, or not.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

We claim:

1. A device for electrically coupling a DUT terminal and a circuit of the DUT, the device comprising:

(a) a fulcrum, (b) a contact lever rockable over a range on the fulcrum by pressing the DUT terminal against it, the lever including a first arm of "X" length on a DUT side of the fulcrum and a second arm of "Y" length on an opposite side of the fulcrum, (c) bias means, having travel, for acting against and through the second arm to resist rocking of the lever, (d) lever travel during rocking being greater than responsive travel of the bias means according to a ratio of X/Y, (e) means for electrically coupling the contact lever and the circuit, and (f) housing means to contain the lever and bias means in relation to each other.

2. The device according to claim 1 wherein the bias means comprises a metal spring.

3. The device according to claim 2 further comprising a U-shaped spring including the fulcrum at an end of one long arm, a second long arm being a leaf spring reacting against the second arm of the contact lever.

4. The device according to claim 3 wherein a longitudinal axis of the spring is generally perpendicular to the motion of the DUT terminal pressing against the contact lever.

5. The device according to claim 3 wherein a longitudinal axis of the spring is generally parallel to the motion of the DUT terminal pressing against the contact lever.

6. The device according to claim 1 further comprising a third arm extending from the contact lever to directly contact a corresponding circuit terminal.

7. The device according to claim 6 wherein the third arm wipes the circuit terminal as it is contacting it.

8. The device according to claim 1 wherein an edge of the contact lever which is pressed by the DUT terminal is serrated to scrub the terminal.

9. An apparatus for electrically coupling a plurality of DUT terminals to corresponding terminals of a circuit, the apparatus comprising:

(a) a corresponding plurality of contact devices aligned both with the DUT terminals and the circuit terminals, each contact device comprising:

(1) a fulcrum, (2) a contact lever rockable over a range on the fulcrum by pressing a corresponding DUT terminal against it, the lever including a first arm of "X" length on a DUT side of the fulcrum and a second arm of "Y" length on an opposite side of the fulcrum, (3) bias means, having travel, for acting against and through the second arm to resist rocking of the lever, (4) means for electrically coupling the contact lever and a corresponding circuit terminal, and (5) lever travel during rocking being greater than responsive travel of the bias means according to a ratio of X/Y;

(b) housing means to contain the lever and bias means of each device in relation to each other.

10. The device according to claim 4 wherein each bias means comprises a metal spring.

11. The device according to claim 5 wherein each contact device further comprises a U-shaped spring including the fulcrum at an end of one long arm, the second long arm being a leaf spring reacting against the second arm of the contact lever.

12. The device according to claim 11 wherein a longitudinal axis of the U-shaped spring is generally perpendicular to the motion of the DUT terminal pressing against the contact lever.

13. The device according to claim 11 wherein a longitudinal axis of the U-shaped spring is generally parallel to the motion of the DUT terminal pressing against the contact lever.

14. The apparatus according to claim 9 wherein each of the contact devices further comprises a third arm extending from the contact lever to directly contact a corresponding circuit terminal.

15. The apparatus according to claim 14 wherein the third arm wipes the circuit terminal as it is contacting it.

16. The apparatus according to claim 9 wherein an edge of each contact lever which is pressed by the corresponding DUT terminal is serrated to scrub the terminal.

* * * * *